United States Patent [19]
You

[11] Patent Number: 5,574,290
[45] Date of Patent: Nov. 12, 1996

[54] SUPERCONDUCTING QUANTUM INTERFERENCE DEVICE

[75] Inventor: Hong K. You, San Gabriel, Calif.

[73] Assignee: Micontech, Inc., San Gabriel, Calif.

[21] Appl. No.: 200,641

[22] Filed: Feb. 23, 1994

[51] Int. Cl.$^6$ ................................................. H01L 39/22
[52] U.S. Cl. ......................... 257/31; 505/162; 505/846; 324/248
[58] Field of Search ............................... 324/248; 427/62, 427/63; 428/930; 505/162, 190, 329, 700, 817, 825, 832, 848, 849, 865, 872, 846, 701, 702, 700; 365/162; 250/336.2; 257/31, 32, 33, 34, 35, 36

[56] References Cited

U.S. PATENT DOCUMENTS

| | | | |
|---|---|---|---|
| 4,280,095 | 7/1981 | Hinton | 324/248 |
| 4,509,146 | 4/1985 | Wang et al. | 365/162 |
| 4,888,622 | 12/1989 | Ishibashi et al. | 257/31 |
| 5,034,374 | 7/1991 | Awaji et al. | 505/329 |
| 5,194,807 | 3/1993 | Ueda | 324/248 |
| 5,326,986 | 7/1994 | Miller, Jr. et al. | 324/248 |

OTHER PUBLICATIONS

Chang, "Interferometric Measurement of magnetic Flux", IBM Technical Disclosure Bulletin, vol. 25, No. 6, Nov. 1982, pp. 2940–2941.

Primary Examiner—Sara W. Crane
Assistant Examiner—Alice W. Tang
Attorney, Agent, or Firm—Hawes & Fischer

[57] ABSTRACT

The SQUID device consists of a loop of superconducting film material applied to the face of a substrate, the loop having a first width. A Josephson Junction is formed in the loop of the superconducting film material by pads of superconducting film material overlying one another and separated by a layer of insulating material. The pads have a second width larger than the first width. To increase the gain and improve the signal-to-noise ratio, the SQUID device may include a plurality of SQUID loops connected to one another in parallel. These loops may be overlie one another, or be adjacent to one another, or both, and may be either conventional SQUID loops or the improved SQUID loops with wide pads.

9 Claims, 3 Drawing Sheets

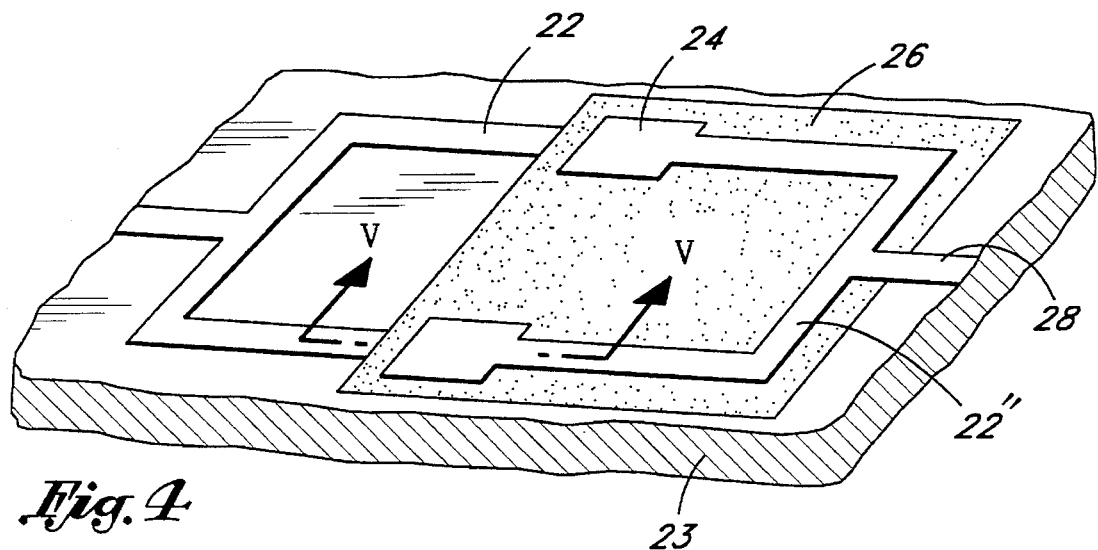
_Fig. 4_
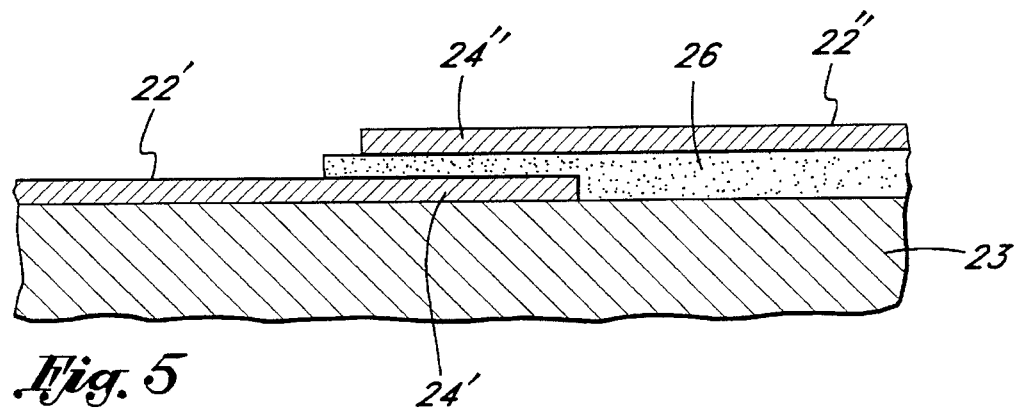
_Fig. 5_
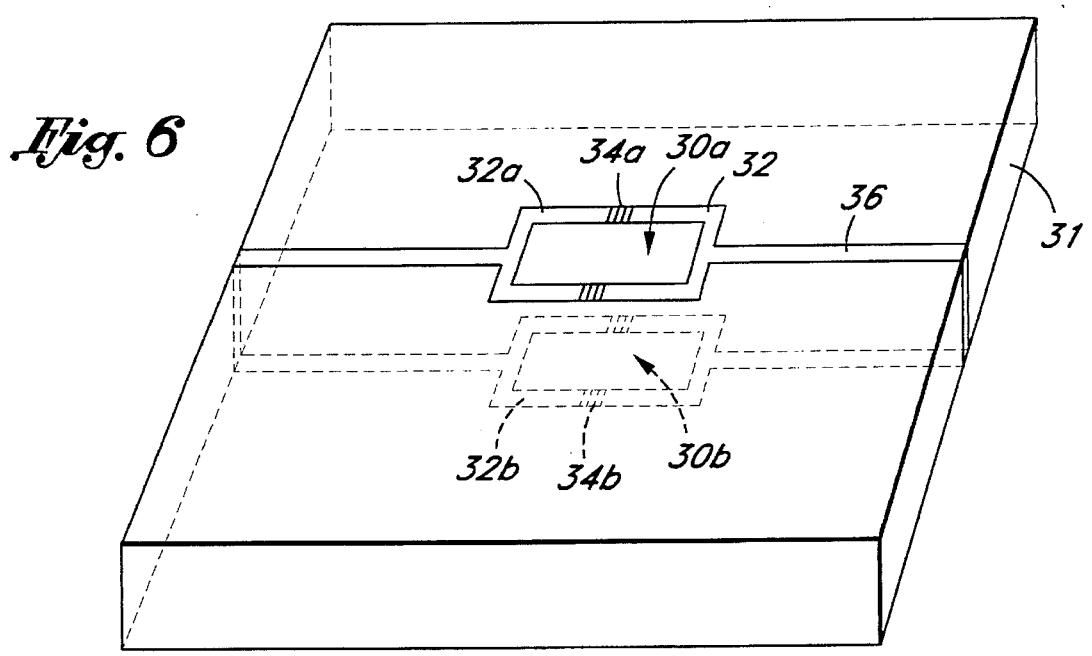
_Fig. 6_

SUPERCONDUCTING QUANTUM INTERFERENCE DEVICE

BACKGROUND OF THE INVENTION

1. Field of the Invention

This invention relates to superconducting quantum interference devices, known as SQUIDs used for measurement of a magnetic flux.

2. Background Art

Superconducting QUantum Interference Devices (SQUIDs) are the most sensitive magnetic field detector known. A SQUID can be configured to measure a minute change of any physical quantity that can be converted to a flux, such as voltage, current or magnetic field. Such devices can have energy resolution capabilities approaching the quantum limit.

There are two kinds of SQUIDs. The first, the dc SQUID, consists of two Josephson Junctions connected in parallel on a superconducting loop. The second, the rf SQUID, involves a single Josephson Junction on a superconducting loop. In both types, the Josephson Junction is formed by a thin insulating barrier or layer between two pieces or sections of superconductor. The insulating barrier's thickness and cross-section are so very much smaller than the dimensions of the complete circuit loop that electron pairs can tunnel from one side of the Junction to the other without transfer of energy. This makes it possible to have current flow in the absence of all applied voltage. Particularly in the dc, two Junction loop, SQUID the current produced by interference oscillates rapidly as one changes the magnetic field.

Typically, a SQUID produces an output voltage which varies in a periodic manner in response to a small input flux. The extreme sensitivity of such a device derives from the fact that the SQUID can resolve a small fraction of $\phi_0$, the quantum of magnetic flux, while $\phi_0$ is itself a very small quantity. Both dc and rf SQUIDs are used, and can be used, as sensors in a wide variety of instruments.

With the advent of high temperature superconductors (HTSC), it has generally been accepted that SQUIDs are one of the few most likely applications for these materials. With the critical temperature of HTSC now higher than the boiling point of liquid nitrogen, the HTSC SQUID can be operated in liquid nitrogen, which is both a much less expensive cryogen and one with a much higher heat capacity. This drastically reduces the coolant cost for the device. Such a HTSC SQUID therefore will certainly be more versatile, economic and easy to use.

Unfortunately, realization of this application has been hampered due to a number of unsolved technical challenges.

The first problem is lack of a reliable technique for fabricating the Josephson Junction; this is the essential element of a vast majority of traditional superconducting electronics. A classic Josephson Junction is extremely difficult to fabricate with HTSC. The main reason for this problem is the very small coherence length of the oxide superconductors which is typically on the order of 1 nm. Hence, to fabricate a good Junction it is necessary to have a S-I interface on an atomic scale. The alternative weak link Junction structure, relying on such linear dimensions, is very hard to fabricate even with the most sophisticated lithographic tools available today. Though dc-SQUIDs fabricated with grain boundaries have shown some substantial progress, it is not clear that such a technique can be extended to producing complex circuits.

The second problem concerns the 1/f noise level in HTSC SQUIDs; it is very high compared with that of low temperature SQUIDs. This noise clearly originates in the Josephson elements, and not in the epitaxial HTSC films, for reasons that are not understood.

The third problem is that the characteristic voltage is low, which might be due to the weak tunnelling current. This further lowers the signal-to-noise ratio.

It is difficult to imagine that HTSC SQUIDs will have significant practical applications unless there is a major improvement in their signal-to-noise ratio and sensitivity.

Accordingly, an object of the present invention is to provide a SQUID design, particularly a HTSC SQUID design, which will achieve a high current gain, high signal-to-noise ratio and high sensitivity.

These and other objects of the invention will be apparent to those of ordinary skill in this field from the following description of preferred embodiments.

SUMMARY OF THE INVENTION

The new SQUID design is based on two different schemes. The first one changes the structure of the Josephson Junction in the loop. The second provides for more complex configurations of the SQUID circuit. These two schemes can be used either separately or in combination. The fabrication of these SQUIDs should prove to be both reproducible and reliable.

Preferably, the SQUID device of the present invention is formed on the face of a substrate. It includes a loop of superconducting material of a first width, and a Josephson Junction formed in the loop by pads of superconducting material overlying one another and separated by a layer of insulating material, the pads having a second width larger than the first width. The layer of insulating material may be substantially larger than the pads; in fact, the layer of insulating material may extend from one pair of pads across the loop to the other pair of pads, if desired.

The SQUID device may be either a single loop or a plurality of loops; of the latter, the loops may overlie one another or be adjacent to one another, or both, the plurality of loops being connected in parallel with one another to increase the current gain and improve the signal-to-noise ratio of the device.

Preferably, the SQUID device of the present invention is fabricated on a substrate by applying a first strip of superconducting material to the substrate, the strip having arms of a first width and at least one pad of a second width larger than the first width. Then an insulating layer is applied over at least the pads, the insulating layer being of the material suitable for forming a Josephson Junction. A second strip of superconducting material is then applied over the insulating material, the second strip having arms of a first width and at least a pad of a second width larger than the first width, the pad of the second strip overlying the pad of the first strip to form a Josephson Junction. Preferably, the device is formed with pads and Josephson Junctions in at least two parallel arms of the loop. A plurality of loops may be formed on the same face, or on opposed faces, or both, of the substrate material, and connected in parallel.

BRIEF DESCRIPTION OF THE DRAWINGS

The invention will be further described in connection with the accompanying drawings in which:

FIG. 4 is a schematic illustration of another construction of the improved SQUID of the present invention.

FIG. 5 is a cross-sectional view taken on lines V—V of FIG. 4;

FIG. 6 is a superimposed SQUID circuit constructed in accordance with the present invention;

DETAILED DESCRIPTION

Figure 1:
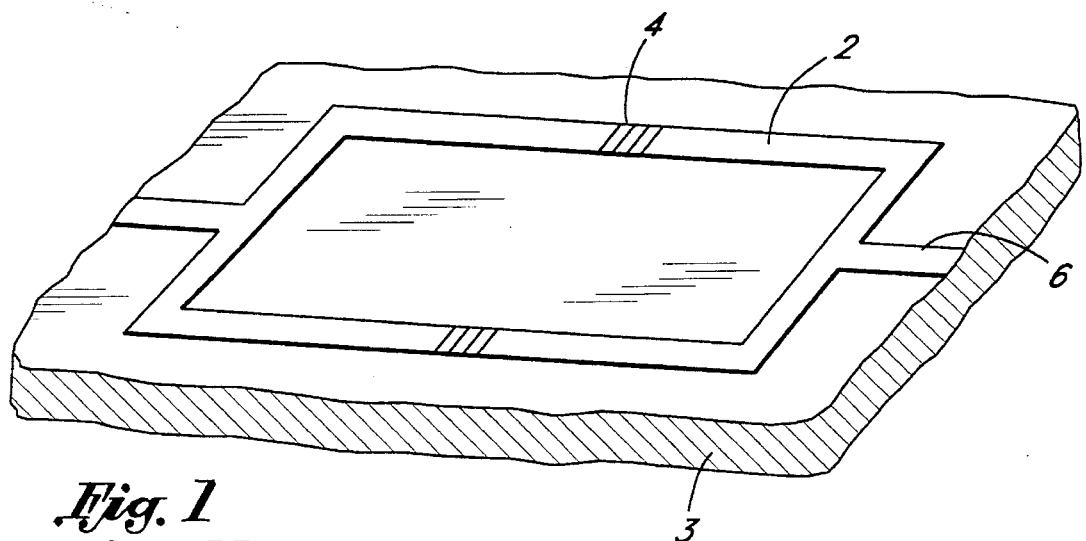
FIG. 1 is a schematic illustration of a typical dc SQUID of the prior art.

The present invention provides a SQUID device and design, particularly a HTSC SQUID design, that achieves high current gain, high signal-to-noise ratio and high sensitivity. Its significance can best be appreciated by comparing it first to a typical dc SQUID, such as the dc SQUID construction shown in FIG. 1. As there are illustrated, a loop 2 of superconducting material on the face of substrate 3 is broken at Josephson Junctions 4 typically on opposed sides of the loop, each Josephson Junction being formed by a thin insulating barrier or layer. Such a construction shown is, for example, in Takagi et al. U.S. Pat. No. 5,077,266 issued Dec. 31, 1991 and titled "Method of Forming Weak-Link Josephson Junction." Connectors 6 extend from opposed sides of the loop to permit the current flowing through the loop to be detected in a well-known fashion. A typical material used to fabricate the conductor 2 is yitrium barium copper oxide ($YBa_2Cu_3O_7$). Typically the Josephson Junction is of a dimension (width and height) comparable to these dimensions of the superconductor, but its length (or thickness) is small. This complicates fabrication of the Junction and appears to contribute significantly to the problems associated with HTSC SQUIDs.

Figure 2:
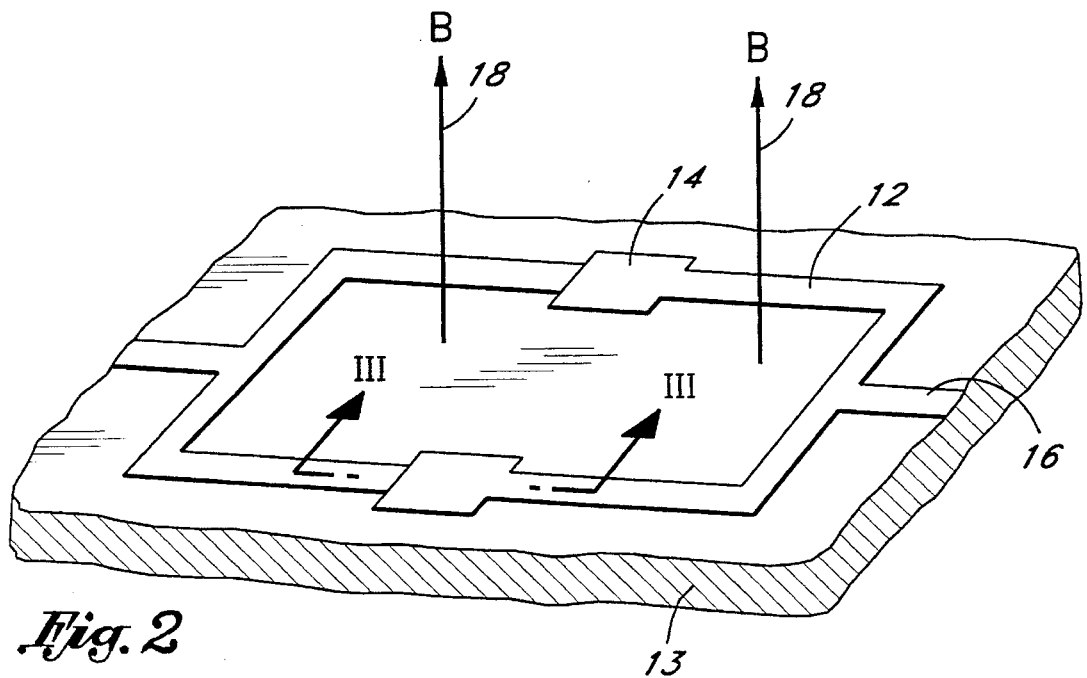
FIG. 2 is a schematic illustration of an improved SQUID constructed in accordance with the present invention.
Figure 3:
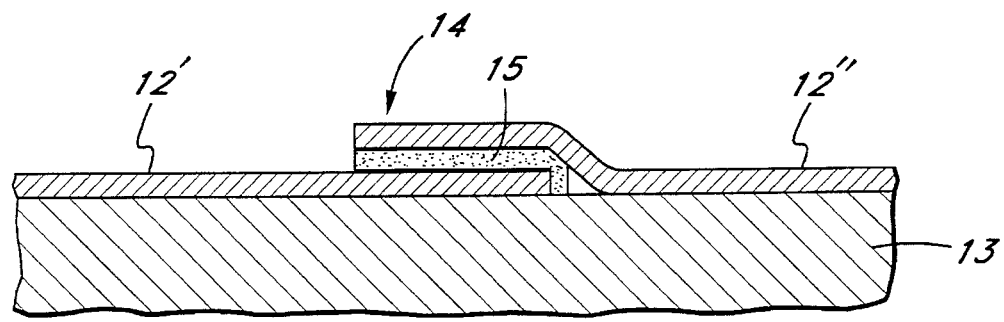
FIG. 3 is a cross-sectional view taken on lines III—III of FIG. 2.

Shown in FIGS. 2 and 3 is a preferred form of SQUID constructed in accordance with the present invention. It consists of a loop 12 of superconducting material on a substrate 13, the loop being broken, preferably on opposed sides, and enlarged to form pads 14. Between overlapping pads 14 is provided the insulating material 15. Thus, by this construction the characteristics of the Josephson Junction are not limited in size to the size of the superconducting loop, but rather may be adjusted as desired to achieve a Junction of the preferred characteristics irrespective of the size of the superconducting loop. Connectors 16 extend from either side of the loop. Thus, on application of a flux B in any direction, such as that indicated by arrows 18, and particularly upon changes in that flux, changes in the superconducting current flowing in loop 12 will occur and may be sensed on connectors 16.

To fabricate the form of SQUID shown in FIG. 2, as shown in FIG. 3 a superconducting thin film 12' is deposited on the face of a substrate, and is patterned to obtain a half SQUID circuit with two enlarged terminal pads 14.

Then an insulating layer 15 is formed on the enlarged terminal pads with the thickness controlled to be in the range compatible to the coherence length scale; this can be achieved by conventional techniques without difficulty.

Then a superconducting thin film 12" is deposited to cover this barrier layer and is patterned to obtain the other half of the SQUID circuit with enlarged terminal pads exactly on the top of terminal pads of film 12'. The Josephson Junction is formed by the two enlarged terminal pads 14 of substantially the same size and coupled by an insulating layer 15. This geometry is totally different from that of standard end-to-end Josephson Junctions. The tunnelling current in this SQUID is virtually perpendicular to the supercurrent in the loop, which is entirely different from that in a conventional SQUID. This planar type Josephson Junction offers significant advantages in the process of fabrication, for it is relatively easy to apply and control. Also, the cross-sectional area of the active barrier Junction is obviously many orders of magnitude greater than that of prior art constructions. This leads to additional advantages for a SQUID which enable the SQUID construction of this invention to enhance the Junction current enormously.

Shown in FIG. 4 is another construction of SQUID employing the principals of the present invention. In this construction, the superconducting loop 22 on the face of substrate 23 is enlarged to provide pads 24 between which is the insulating material 26. In this construction, however, the material does not just cover the pad areas, but rather extends across the face of the planar element. The remaining portion 22" of the superconducting circuit is applied on top of this pad to achieve the other half of the superconducting loop. Connectors 28 extend from opposed sides of the loop.

To fabricate this construction, as shown in FIG. 5 preferably the first half 22' of the superconducting loop is applied to the substrate. Then, instead of an insulating layer being formed only on the top of the enlarged terminal pads, an insulating layer 26 covering the two bottom enlarged terminal pads 24' is formed to extend over half of the substrate; its thickness is in the range of coherence length. Then a superconducting layer 22" is deposited on the insulating layer 26, and is pattern to obtain the other half loop of the SQUID with enlarged terminal pads 24" exactly on overlying pads 24'.

Basically, this provides two half SQUID loops on two separate superconducting film layers coupled by an insulating layer. The size of the insulating layer is not critical as long as it covers the enlarged terminal pads. This construction avoids the need to accurately apply or define the insulating layer, further simplifying fabrication of the SQUID of the present invention.

In accordance with the SQUID circuit of the present invention, various other circuit configurations are also feasible. For example, nested or parallel SQUID loops can easily be formed. Also, stacked SQUID loops can be fabricated.

FIG. 6 illustrates two superconducting loops 30a and 30b applied on opposed faces of substrate 31. Each loop consists of a superconductor 32 broken at opposed portions such as 34a and 34b to provide form Josephson Junctions, preferably fabricated in accordance with the teachings previously given in this detailed description. (However, because of the advantages of these circuits, even known SQUIDs may be used.) The two loops 30a and 30b are connected to one another by connectors 36, the resulting output signal on conductor 36 being the combined signals of loops 30a and 30b. Of course, additional loops can be stacked on top of these loops to provide a multi-layer structure, in a manner that will be apparent to those Of ordinary skill in this field.

Figure 7:
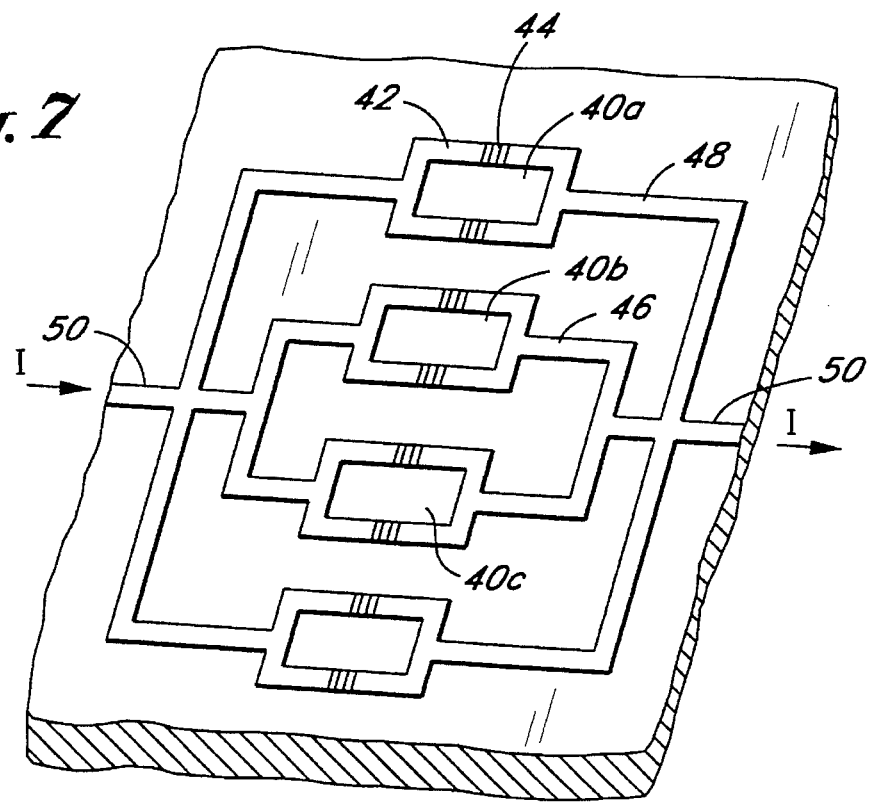
FIG. 7 is first parallel SQUID circuit constructed in accordance with the present invention.

FIG. 7 illustrates a nested SQUID circuit consisting of SQUID subcircuits 40a, 40b, 40c, etc. Each SQUID subcircuit consists of a loop of superconducting material 42 that incorporates a pair of opposed Josephson Junctions 44 preferably formed in accordance with the teachings previously given in this detailed description (although again because of the advantages of these circuits even known SQUIDs may be used). The two center loops, such as loops 40b and 40c, are connected into a superconducting loop by superconducting connector 46, and the outer subloops are connected by connector 48 of superconducting material which in turn is connected to loop 46 by connecting lines 50. By this circuit, significant improvements in the gain or sensitivity of the SQUID can be achieved, which can be further affected by stacking SQUID circuits such as those shown in FIG. 7, on top of one another.

Figure 8:
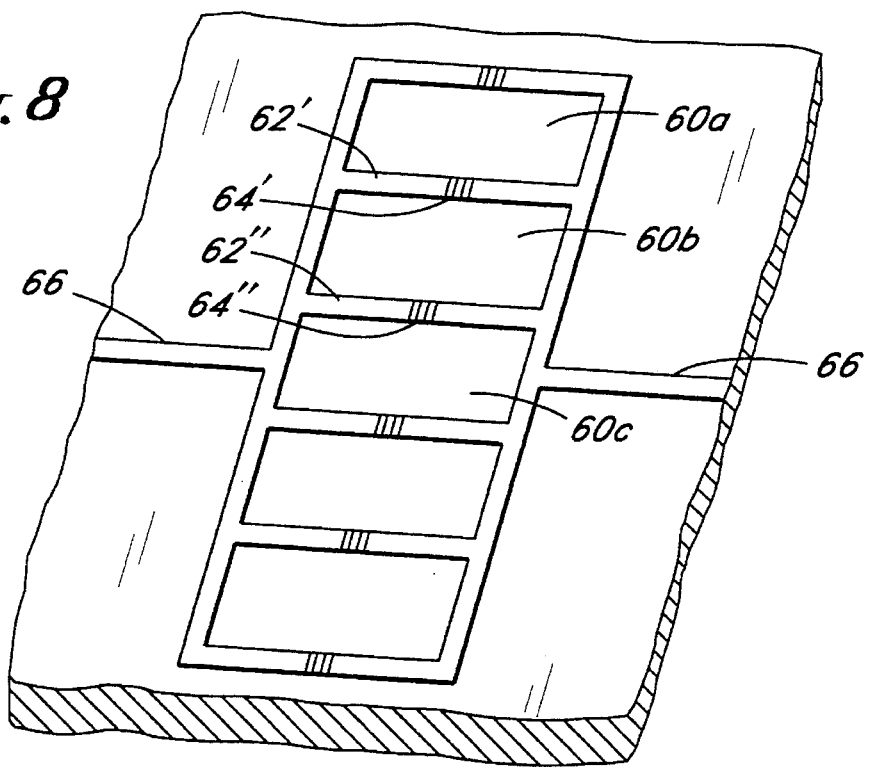
FIG. 8 is a second parallel SQUID circuit of the present invention.

FIG. 8 illustrates another construction in which SQUID loops are connected in parallel with one another. Specifically, SQUID loop 60a is connected in parallel with loops 60b, 60c, etc. by the loops consisting of, or having, common arms 62', 62" etc. and common Josephson Junctions. Output connectors 66 are provided to permit the combined current flow in all of these loops to be sensed. Of course, this construction of SQUID also permits layers to be stacked on top of one another to achieve even greater sensitivity and ultra-high performance. Preferably, the Josephson Junctions of these SQUID subelements are formed in accordance with the teachings previously given in this detailed description.

In at least the FIGS. 6–8 Josephson Junction designs may employ other geometry if desired, such as weak link, grain boundary or step edge geometry, such as shown in DiLorio et al. U.S. Pat. No. 5,134,117, dated Jul. 28, 1992, for a HIGH TEMPERATURE MICROBRIDGE SUPERCONDUCTOR DEVICE UTILIZING STEPPED EDGE-TO-EDGE SNS JUNCTION, Shinada U.S. Pat. No. 5,227,645, dated Jul. 13, 1993 for a DC SQUID ELEMENT WITH QUASI-PLANAR-TYPE JOSEPHSON JUNCTION, Marsden U.S. Pat. No. 5,202,630, dated Apr. 13, 1993, for a THIN FILM SQUID DETECTOR INCLUDING A LOOP RESPONSIVE TO A MAGNETIC FLUX COMPONENT LYING IN THE PLANE OF THE THIN FILM, Marsden U.S. Pat. No. 5,142,229, dated Aug. 25, 1992, for THIN FILM . . . SQUID DETECTORS, Takagi et al. U.S. Pat. No. 5,077,266, dated Dec. 31, 1991, for a METHOD OF FORMING WEAK-LINK JOSEPHSON JUNCTION, AND SUPERCONDUCTING DEVICE EMPLOYING THE JUNCTION, Kapitulnik U.S. Pat. No. 5,219,826, dated Jun. 15, 1993, for a SUPERCONDUCTING JUNCTIONS AND METHOD OF MAKING SAME, Young et al. U.S. Pat. No. 4,418,095, dated Nov. 29, 1983, for a METHOD OF MAKING PLANARIZED JOSEPHSON JUNCTION DEVICES, Hed U.S. Pat. No. 5,171,732, dated Dec. 15, 1992, for a METHOD OF MAKING A JOSEPHSON JUNCTION, Ishibashi et al. U.S. Pat. No. 4,888,622, dated Dec. 19, 1989, for a SUPERCONDUCTOR ELECTRON DEVICE, Wang et al. U.S. Pat. No. 4,509,146, dated Apr. 2, 1985, for a HIGH DENSITY JOSEPHSON JUNCTION MEMORY CIRCUIT, or Tarutani et al. U.S. Pat. No. 4,319,256, dated Mar. 9, 1982, for a JOSEPHSON JUNCTION ELEMENT.

While preferred forms of the present invention have been illustrated and described, other forms will be readily apparent to those of ordinary skill in this field. Accordingly, the invention is set forth in the following claims:

I claim:

1. A SQUID device on a face of a substrate, the SQUID including a first loop of superconducting film material, the material having a first width;

at least a Josephson Junction in the first loop of superconducting film material, the Josephson Junction having pads of superconducting film material overlying one another and separated by a layer of insulating material having a second width, the pads having a third width larger than the first width and equal to or less than the second width, the width of pads being substantially the same.

2. A SQUID device as set forth in claim 1 in which the first loop includes at least a second Josephson Junction.

3. A SQUID device as set forth in claim 2 in which the Josephson Junctions are on opposed arms of the loop.

4. A SQUID device as set forth in claim 3 in which the layer of insulating material is substantially larger than the adjacent pads.

5. A SQUID device as set forth in claim 4 in which the layer of insulating material extends between pads on opposed arms of the first loop.

6. A SQUID device as set forth in claim 1 including at least a second loop of superconducting film material, the second loop having a fourth width, and a Josephson Junction in the second loop of superconducting film material the Josephson Junction in the second loop having pads of superconducting film material overlying one another and separated by a layer of insulating material, the pads in the Josephson Junction of the second loop having a fifth width larger than the fourth width, the width of the pads of the Josephson Junction of the second loop being substantially the same, and means connecting said first loop and second loop in parallel.

7. A SQUID device as set forth in claim 6 in which the first loop and second loop overlie one another.

8. A SQUID device as set forth in claim 6 in which the first loop and second loop are side by side.

9. A SQUID device as set forth in claim 8 in which the first loop and the second loop include common conductors.

* * * * *